(12) United States Patent  (10) Patent No.: US 9,302,679 B2
Graumann  (45) Date of Patent: Apr. 5, 2016

(54) CONTROL PANELS

(75) Inventor: David L. Graumann, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 45 days.

(21) Appl. No.: 13/977,521

(22) PCT Filed: Dec. 29, 2011

(86) PCT No.: PCT/US2011/067861
§ 371 (c)(1),
(2), (4) Date: Feb. 24, 2015

(87) PCT Pub. No.: WO2013/101076
PCT Pub. Date: Jul. 4, 2013

(65) Prior Publication Data
US 2015/0158501 A1 Jun. 11, 2015

(51) Int. Cl.
B60W 50/14 (2012.01)
B60K 37/06 (2006.01)
G06F 3/02 (2006.01)
H03K 17/96 (2006.01)

(52) U.S. Cl.
CPC .............. B60W 50/14 (2013.01); B60K 37/06 (2013.01); G06F 3/0202 (2013.01); H03K 17/9629 (2013.01); H03K 17/9631 (2013.01); B60K 2350/2047 (2013.01); H01H 2239/022 (2013.01)

(58) Field of Classification Search
CPC ......... B60W 50/14; Y02P 20/55; B60Q 1/24; B60Q 1/2661; B60Q 1/525; B60Q 2400/40; B60Q 2400/50; B60Q 9/002; B60Q 9/008; G01P 13/035; G01P 3/38; G01P 3/68; G02B 2027/014; G02B 27/01; G02B 27/0101; G02B 27/0944; G08G 1/04; G08G 1/052; G08G 1/056
USPC .............. 435/6.11, 283.1; 427/2.13; 340/435, 340/935
See application file for complete search history.

(56) References Cited

U.S. PATENT DOCUMENTS 5,482,867 A * 1/1996 Barrett ................. C07D 233/38
427/2.13
6,994,964 B1 * 2/2006 Chang .................... C07H 21/00
435/6.11
7,144,700 B1 * 12/2006 McGall ................. C07H 21/00
435/283.1
8,823,552 B1 * 9/2014 Raphael ................ B60Q 9/002
340/435

(Continued)

FOREIGN PATENT DOCUMENTS

CN 101055193 10/2007
JP 46-013562 10/1971

(Continued)

OTHER PUBLICATIONS

International Preliminary Report on Patentability and Written Opinion received for PCT Patent Application No. PCT/US2011/067861, mailed on Jul. 10, 2014, 9 Pages.

(Continued)

Primary Examiner — Muhammad Shafi
(74) Attorney, Agent, or Firm — Sutherland Asbill & Brennan LLP

(57) ABSTRACT

Control panels with input elements for controlling components corresponding to each of the controls. The input elements can further be actuated by detecting an optical reflection associated with an input element.

30 Claims, 7 Drawing Sheets

(56) References Cited

U.S. PATENT DOCUMENTS

| | | |
|---|---|---|
| 2003/0019732 A1 | 1/2003 | Hunt |
| 2005/0029431 A1 | 2/2005 | Saegusa |
| 2011/0080306 A1* | 4/2011 | Leopold .................... G01P 3/38 340/935 |

FOREIGN PATENT DOCUMENTS

| | | |
|---|---|---|
| JP | S47-076898 | 12/1974 |
| JP | 61-200718 A | 9/1986 |
| JP | H02189834 | 7/1990 |
| JP | 07-114851 A | 5/1995 |
| JP | 07-220592 A | 8/1995 |
| JP | 2001-155576 A | 6/2001 |
| JP | 2004-301797 | 10/2004 |
| JP | 2005-051485 | 2/2005 |
| JP | 2006-065908 | 3/2006 |
| WO | 2013/101076 A1 | 7/2013 |

OTHER PUBLICATIONS

International Search Report and Written Opinion received for PCT Application No. PCT/US2011/067861, mailed on Sep. 20, 2012, 12 pages.

Office action for Japanese Patent Application 2014-548781 mailed Jun. 2, 2015.

Office Action for Chinese Patent Application 201180076049.X mailed Nov. 30, 2015. 5 pages Chinese Office Action. 6 Pages English Translation.

* cited by examiner

CONTROL PANELS

TECHNICAL FIELD

This invention generally relates to methods, systems, and apparatus for control panels.

BACKGROUND

Drivers of vehicles, such as cars, may desire to control several components of the vehicle for purposes of safety, comfort, or utility. As a result, vehicles typically have several controls to control one or more components of the vehicle. Some common controls in vehicles may include, for example, radio controls to set tuning or volume, climate controls to set air conditioning and heat levels, and defroster controls to set the level of defrosting of windows of the vehicle.

Often times, conventional controls on vehicles may be organized in clusters. For example, passenger cars may have a center console between the driver's side and the passenger's side at the front of a cab of the car where several control surfaces and interfaces are situated. Controls for the radio, navigation system, heater, air conditioners, and other components are often provided on the center console. The center console, in many cases, may be relatively crowded with controls due to the large number of components in modern vehicles that can be controlled or that otherwise require user interaction. Often times, the center console may extend from the dashboard of the vehicle at its top to the transmission tunnel at its bottom to fit all the controls required on the vehicle.

Typical control clusters and control surfaces on vehicles include a switch or other user input interface electrically coupled to an electronic device, such as a controller via wiring. The controller typically determines the switches or interface elements that are actuated and translates the same to a controllable function. Therefore, each control interface of the vehicle may have dedicated wiring or dedicated controller hardware. The controls and associated hardware add materials and complexity to a controls infrastructure. This may add undesired weight to a vehicle. Furthermore, the controls may be relatively expensive to implement due to considerable dedicated electrical infrastructure provided therefore. Additionally, repairs to vehicle controls may be relatively difficult as the repairs may require troubleshooting the electrical infrastructure associated with each of the controls.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE INVENTION

Figure 1:
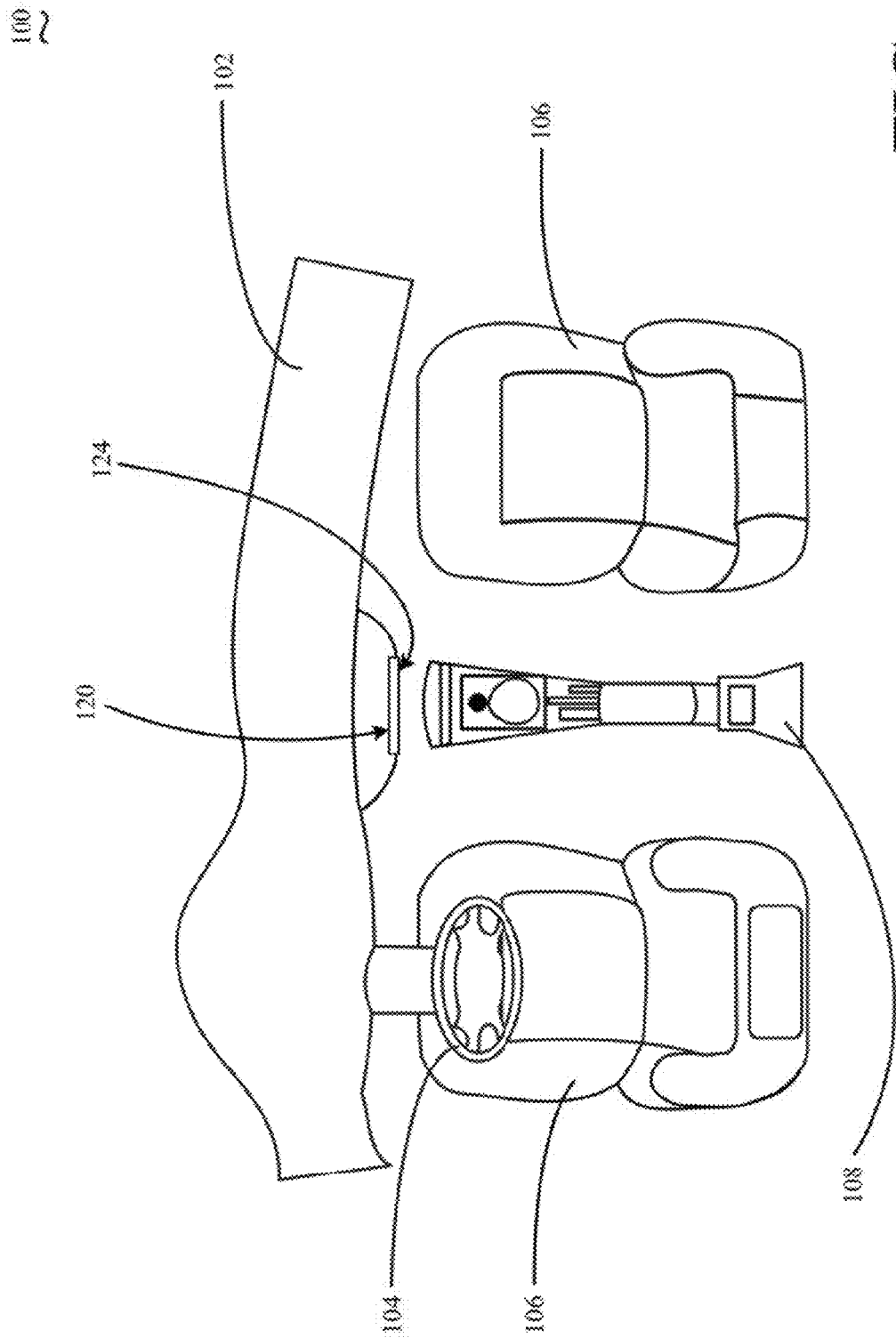
FIG. 1 is a simplified top-down schematic view illustrating an example vehicle cockpit with vehicle controls that can be operated in accordance with embodiments of the disclosure.
Figure 2:
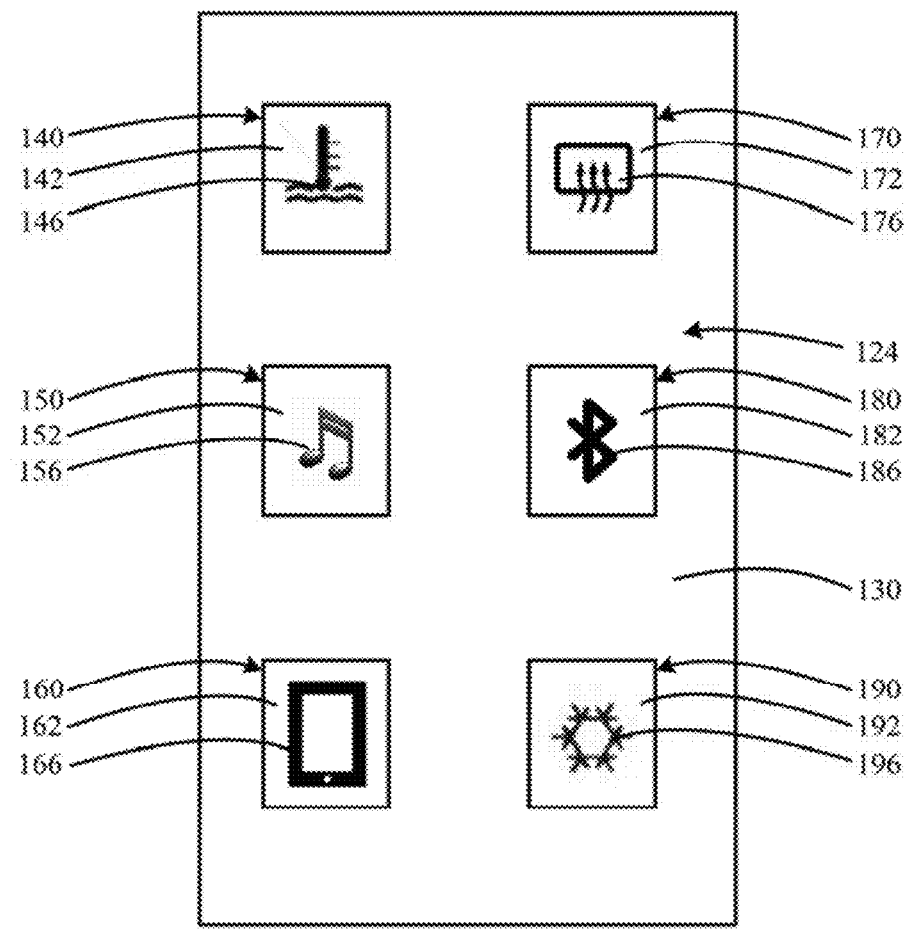
FIG. 2 is a simplified schematic front view diagram illustrating an example control panel of the vehicle cockpit of FIG. 1 including input elements provided thereon and operating in accordance with embodiments of the disclosure.

Embodiments of the disclosure are described more fully hereinafter with reference to the accompanying drawings, in which embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Embodiments of the disclosure may provide apparatus, systems, and methods for interpreting user input on control panels and generating component control signals based on the same. In one aspect, user interactive controls associated with components of a vehicle may be provided on a control surface of a vehicle and may be actuated by the user, and the actuation may be detected by an optical sensing mechanism. The control interface may include any number of input elements that may be selectively mounted on a control cluster or control panel, such as a center console or other surface of a vehicle. The input elements may have any number of indicia disposed thereon for identification of various input elements. A user may touch one or more of the input elements to activate or control components associated with the selected one or more input elements. In certain aspects, the mounted input elements may be free of electrical connections. In other aspects, the each of the input elements may have one or more respective corresponding reflective elements provided thereon. In certain embodiments, the reflective elements may provide an optical reflection in an nonactuated state of the input elements that may be detected using a sensor, such as a photodetector or image sensor. In an actuated state of the same input element, or when the user interacts with the input element to effect a control function associated therewith, the optical reflection from the reflective elements associated with the input element may change, and the change may be detected using the sensor. Signals from the sensor may be provided to a system that interprets the signal to determine a control function intended by the user of the control panel. In one aspect, the detected reflection from a particular input element may be unique relative to the detected reflection from other input elements.

In certain other embodiments, the reflective elements may not provide an optical reflection in an nonactuated state. In an actuated state of the same input element, or when the user interacts with the input element to effect a control function associated therewith, the reflective elements associated with the input element may provide an optical reflection and the same may be detected using the sensor. Each input element may further provide a unique optical reflection relative to the other input elements.

With the control panels or clusters, as disclosed herein, the control surfaces of the vehicle may be completely passive. All the controls may be interpreted by detecting optical reflections or by computer vision. Therefore, electronics associated with sensing the actuation of a mechanical switch or dial, or the like, may not be needed. As a result, control panels as disclosed herein may reduce control infrastructure complexity, weight, as well as enhance serviceability. Therefore, the control panels may reduce the cost of any one or more of the control clusters, control infrastructure, the dashboard, or the vehicle.

Example embodiments of the disclosure will now be described with reference to the accompanying figures.

Referring now to FIG. 1, a vehicle cockpit 100 may include a dashboard 102, steering wheel 104, seats 106, and a center arm rest 108. Extending from or incorporated into the dashboard may be a control panel, such as a center console 120 that may include a front face 124. When a user of the vehicle, such as a driver of the vehicle, wishes to control components of the vehicle, such as an audio system or climate controls, the user may interact with the center console 120 to effect such controls.

For purposes of this discussion, the vehicle can include, but is not limited to, a car, a truck, a light-duty truck, a heavy-duty truck, a pickup truck, a minivan, a crossover vehicle, a van, a commercial vehicle, a private vehicle, a sports utility vehicle, a tractor-trailer, an aircraft, an airplane, a jet, a helicopter, a space vehicle, a watercraft, or any other suitable vehicle having a relatively closed cockpit. However, it will be appreciated that embodiments of the disclosure may also be utilized in other environments where control of components may be implemented. It should also be noted that although control elements of the vehicle are shown as a center console, control panels, or even single controls may be provided on any of the surfaces of the interior of the vehicle in accordance with embodiments of the disclosure. For example, a control surface may be provided on any one of the dashboard 102, the steering wheel 104, the seats 106, the center arm rest 108, the doors (not shown), or the like.

Referring now to FIT. 2, an illustrative center console 120 may include a front surface 130 of the front face 124 and a plurality of input elements 140, 150, 160, 170, 180, and 190 mounted thereon. Each input element 140, 150, 160, 170, 180, and 190 may have a front surface 142, 152, 162, 172, 182, and 192, respectively, with an indicia 146, 156, 166, 176, 186, and 196, respectively, provided thereon. The indicia 146, 156, 166, 176, 186, and 196 may be indicative of a respective corresponding functionality associated with each of the input elements 140, 150, 160, 170, 180, and 190. For example, the thermometer indicia 146 of input element 140 may be indicative of a heater of the vehicle. Therefore, the input element 140 when provided on the center console 120 may be associated with controlling the heater of the vehicle. Likewise, input element 150 may be associated with a sound system of the vehicle, input element 160 may be associated with a cellular telephone of the user, input element 170 may be associated with a defroster system, input element 180 may be associated with a Bluetooth® controller, and input element 190 may be associated with an air conditioning system. The center console 120, input elements 140, 150, 160, 170, 180, and 190, and the associated indicia 146, 156, 166, 176, 186, and 196 may take any suitable shape and may be associated with any number of different controls provided to an occupant of a vehicle.

The front surface 142, 152, 162, 172, 182, and 192 on each of the input elements 140, 150, 160, 170, 180, and 190 may be substantially flush with the front surface 130 of the center console 120. Alternatively, as desired, the front surfaces 142, 152, 162, 172, 182, and 192 may protrude outwardly from or be recessed relative to the front surface 140 of the center console 120.

While shown in the form of a relatively flat square component, it will be appreciated that input elements may be in any suitable form, including, but not limited to, knobs, dials, sliders, rockers, or ridged surfaces. Certain forms of input elements may provide for a relatively appealing tactile experience. In certain embodiments, one or more input elements may include a round shape. In other embodiments, the input elements may include a dial that can be rotated by a user to effect a corresponding control function. In yet other embodiments, the input elements may include a slider that may have a sliding element that can be manipulated by a user to effect a corresponding control function. In one aspect, such input elements may mimic active dials that users may be familiar with, but may be passive in nature. Furthermore, the input elements of various forms may, in certain embodiments, provide haptic feedback, such as vibration or rumbling. It should also be appreciated that the input elements may be mounted to the control panel 120 using any suitable elements for mounting, including but not limited to, magnetic mounting, hook and loop fasteners, such as Velcro®, mechanical fasteners, screws, allen screws, nails, bosses, adhesives, or combinations thereof.

The input elements 140, 150, 160, 170, 180, and 190 may be constructed using any suitable materials, for example, lightweight thermoplastic materials such as polyethylene terephthalate (PET), poly-vinyl chloride (PVC), polytetrafluoroethylene (PTFE), polymethyl methacrylate (PMMA or acrylic glass), polyethylene (PE), or the like. In certain embodiments, the input elements 140, 150, 160, 170, 180, and 190 may be formed by any number of suitable molding processes, such as injection molding. Alternatively, the input elements 140, 150, 160, 170, 180, and 190 may be formed using extrusion processes. The use of various polymeric materials, including thermoplastic and thermosetting plastics, may provide for a relatively appealing tactile and aesthetic appearance. Additionally, input elements 140, 150, 160, 170, 180, and 190 constructed from plastic materials may be formed relatively inexpensively and may provide for a relatively high level of durability, especially within the interior of a vehicle, where the input elements 140, 150, 160, 170, 180, and 190 may experience extreme temperatures in certain geographies and climates.

Input elements 140, 150, 160, 170, 180, and 190 may alternatively be formed using other non-plastic materials including, but not limited to metals, glass, ceramics, natural fibers, wood, paper, cardboard, composites, or combinations thereof. As an example, the input elements may be formed from metals using stamping processes. In certain embodiments, a particular look or finish may be desired where input elements of a particular construct may be desired. For example, if a vehicle interior has a brushed nickel finish, it may be desirable to construct the input elements 140, 150, 160, 170, 180, and 190 using metal, since other materials, such as wood or plastic, may clash with the overall styling or aesthetics of the vehicle interior.

While six input elements 140, 150, 160, 170, 180, and 190 are shown mounted to the front face 124 of the center console 120, there may be any number of input elements. Furthermore, there may be any amount of spacing between input elements in the vertical, horizontal, or diagonal directions in accordance with embodiments of the disclosure. As a non-limiting example, in certain embodiments, there may be nine input elements arranged in a three input element by three input element arrangement. Additionally, the input elements 140, 150, 160, 170, 180, and 190 may be of any suitable shape.

Figure 3:
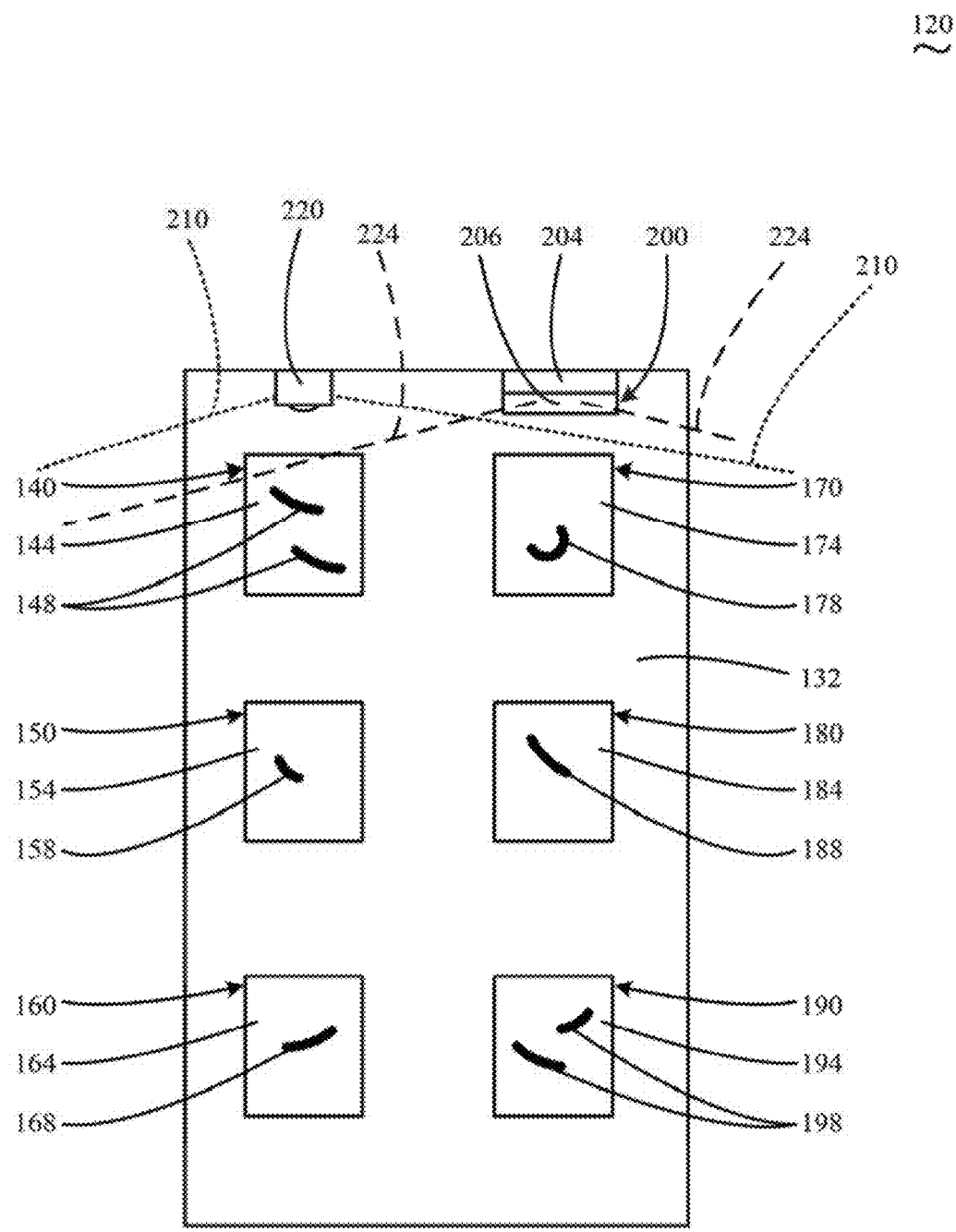
FIG. 3 is a simplified schematic rear view diagram of the example control panel of FIG. 2 illustrating reflective elements provided on the input elements in accordance with embodiments of the disclosure.

Referring now to FIG. 3, a rear side of the example center console 120 may include a rear surface 132, an illumination source 200, and an optical sensor, such as an image sensor 220. The illumination source 200 and the image sensor 220 may be provided near a top end of the rear surface 132 of the center console 120. In other embodiments, the illumination source 200 and the image sensor 220 may be provided at any suitable position of the center console 120. For example, the illumination source 200 and the image sensor 220 may be located near a bottom or side edges of the rear surface 132 of the center console 120. As further alternatives, the illumination source 200 and the image sensor 220 may be placed at different sides of the rear surface 132 of the center console 120. The illumination source 200 may include an optical source 204 and an optical element 206 to generate an illumination plane, such as a laser plane bound by the boundaries 224.

In certain embodiments, the optical source 204 may be an emitter of coherent radiation, such as a light amplification by stimulated emission of radiation (laser) device emitting a laser beam at one or more wavelengths. The wavelengths may be, for example, in the infrared region of the spectrum, and therefore, not visible to a user of the center console 120. Alternatively, the wavelength may be in the near near-ultraviolet (UV) range. As a further alternative, the wavelength of the optical source 204 may be provided in the visible range of about 380 nm to about 750 nm. The optical source 204 may be any known coherent radiation source including, but not limited to diode lasers, quantum well lasers, solid state lasers, gas lasers, or combinations thereof. In other embodiments, the optical source 204 may not be a source of coherent radiation. For example, the optical source 204 may be a light emitting diode (LED) emitting radiation at any variety of wavelengths.

The optical element 206, may be any variety or combination of lenses, reflectors, or waveguides. In certain aspects, the optical element 206 may be able to provide a radiation plane from a point or near-point optical source 204. In certain embodiments, the optical element 206 may be a cylindrical lens that provides a relatively planar optical output from a relatively point-like optical source 204. In certain other embodiments, the optical element 206 may be a Fresnel lens that provides a relatively wide dispersion of optical output from a relatively narrow optical input. In certain further embodiments, the optical element 206 may be a mechanical element that rasters or scans the output from the optical source 204 to provide a laser plane.

The image sensor 220 may be any known device that converts an optical image or optical input to an electronic signal. The image sensor 220 may be of any suitable variety including a charge coupled device (CCD), complementary metal oxide semiconductor (CMOS) sensors, or the like. The image sensor 220 may further be of any pixel count and aspect ratio. Furthermore, the image sensor 220 may be sensitive to any frequency of radiation, including infrared, visible, or near-UV. In one aspect, the image sensor 220 has a frequency range of sensitivity that includes the frequency of the illumination source 200.

It should be appreciated that while an image sensor 220 is depicted in FIG. 3, any suitable optical detection device may alternatively be utilized in accordance with embodiments of the disclosure. For example, a photodetector, a one dimensional array of photodetectors, or a two dimensional array of photodetectors may be used in accordance with certain embodiments of the disclosure.

It should also be noted, that while a single illumination source 200 and a single image sensor 220 are illustrated as part of the center console 120, there may be any number of illumination sources 200 and image sensors 220. For example, there may be two illumination sources, where each illumination source provides radiation of the same wavelength or a different wavelength. There may be two laser planes generated by the two illumination sources where each of the laser planes may comprise illumination of a different wavelength from each other. Furthermore, there may be a single image sensor that can detect both wavelengths. Alternatively, there may be provided two separate image sensors, each configured to detect only one of the wavelengths corresponding to one of the laser planes generated by one of the two illumination sources.

Figure 4:
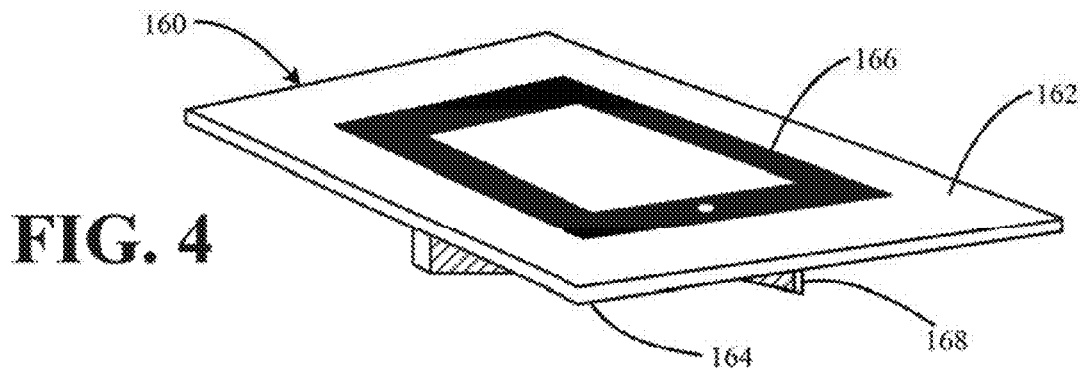
FIG. 4 is a simplified perspective view diagram of an example input element associated with the control panel of FIGS. 2 and 3 in accordance with embodiments of the disclosure.

With continuing reference to FIG. 3 and additional reference to FIG. 4, depicting the example input element 160 in perspective view, features of the input elements are further disclosed. Each of the input elements 140, 150, 160, 170, 180, and 190 may have one or more reflective elements 148, 158, 168, 178, 188, and 198 respectively extending from the rear surfaces 144, 154, 164, 174, 184, and 194 of the input elements 140, 150, 160, 170, 180, and 190. The reflective elements 148, 158, 168, 178, 188, and 198 may be associated with the respective corresponding functionality of each of the input elements 140, 150, 160, 170, 180, and 190 to the hardware and systems associated with the center console 120, as will be described with reference to FIG. 7.

In one aspect, the reflective elements 148, 158, 168, 178, 188, and 198 may be associated with the functions and controls to which the respective input reflective element 140, 150, 160, 170, 180, and 190 of the control panel 120 are associated. Each of the reflective elements 148, 158, 168, 178, 188, and 198 may be unique and, therefore, may be uniquely identified with its respective input element 140, 150, 160, 170, 180, and 190, as well as, functions and components associated therewith. The reflective elements 148, 158, 168, 178, 188, and 198 may have unique size, length, shape, curvature, protrusion from the respective rear surfaces 144, 154, 164, 174, 184, and 194, or combinations thereof. Additionally, in certain embodiments, the reflective elements 148, 158, 168, 178, 188, and 198 may not be continuous.

As depicted, each of the reflective element 148, 158, 168, 178, 188, and 198 have unique physical characteristics, and therefore, in certain embodiments, may be identified by their unique physical characteristics. For example, as depicted, reflective elements 148 and 198 may be discontinuous while others are not. Furthermore, one or more of the reflective elements, such as reflective element 158, may be relatively shorter in length than other reflective elements, such as reflective element 188. Further, one or more of the reflective elements, such as reflective element 168, may be oriented in a different direction than other reflective elements, such as reflective element 188. Still further, one or more of the reflective elements, such as reflective element 168, may have a different curvature or concavity than other reflective elements, such as reflective element 188. Therefore, some of the reflective elements 148, 158, 168, 178, 188, and 198 may have a different focal length than the other of the reflective elements 148, 158, 168, 178, 188, and 198.

As a further alternative, certain reflective elements 148, 158, 168, 178, 188, and 198 may be partially transmissive and, therefore, partially reflective. Certain reflective elements 148, 158, 168, 178, 188, and 198 may have a different transmittance to reflectance ratio than the other reflective elements 148, 158, 168, 178, 188, and 198. As a further alternative, certain reflective elements 148, 158, 168, 178, 188, and 198 may have a different shape than other of the reflective elements 148, 158, 168, 178, 188, and 198. For example, certain reflective elements 148, 158, 168, 178, 188, and 198 may have a relatively flat shape while others may have a relatively parabolic shape, and others still may be a relatively spherical shape. Furthermore, different reflective elements 148, 158, 168, 178, 188, and 198 may exhibit different levels of specular reflection. In other words, certain reflective elements 148, 158, 168, 178, 188, and 198 may have a different surface finish and, therefore, a different reflectivity than other of the reflective elements 148, 158, 168, 178, 188, and 198. For example, certain reflective elements 148, 158, 168, 178, 188, and 198 may have a glossy black finish while others may have a matte black finish, and others still may have a shiny silver finish.

The unique characteristics of each reflective elements 148, 158, 168, 178, 188, and 198 may, therefore, be indicative of the respective corresponding input elements 140, 150, 160, 170, 180, and 190. For example, the reflective element 148 may indicate that the input element 140 may be associated with controlling the heater of the vehicle. Likewise, reflective element 158 may indicate that input element 150 may be associated with the sound system of the vehicle, reflective element 168 may indicate that input element 160 may be associated with the cellular telephone of the user, reflective element 178 may indicate that input element 170 may be associated with the defroster system, reflective element 188 may indicate that input element 180 may be associated with the Bluetooth® controller, and reflective element 198 may indicate that input element 190) may be associated with the air conditioning system.

The reflective elements 148, 158, 168, 178, 188, and 198 may be fabricated from a relatively compressible material, such as foam or rubber. In one aspect, the compressible material may further be coated with a material to provide a particular optical reflectivity there from. In other embodiments, the reflective elements 148, 158, 168, 178, 188, and 198 may be fabricated from relatively non-compressible materials, such as thermoplastic or thermosetting polymers or metals.

In certain embodiments, the laser plane, as bound by boundaries 224, may be in proximity rear surfaces 144, 154, 164, 174, 184, and 194 of the input elements 140, 150, 160, 170, 180, and 190. Furthermore, in certain embodiments, the field of view of the image sensor 220, as bound by boundaries 210, may also be able to view all of the input elements 140, 150, 160, 170, 180, and 190 and in particular the reflective elements 148, 158, 168, 178, 188, and 198 thereon. As a result, the laser plane may reflect off of the reflective elements 148, 158, 168, 178, 188, and 198 on each of the input elements 140, 150, 160, 170, 180, and 190, and the field of view of the image sensor 220 may be such that the image sensor 220 may detect the reflected light.

The laser plane, as emitted by the illumination source 200, may reflect off of the reflective elements 148, 158, 168, 178, 188, and 198 when the respective input elements 140, 150, 160, 170, 180, and 190 are not actuated. When the user interacts one of the input elements 140, 150, 160, 170, 180, and 190, the reflection off of the respective reflective element 148, 158, 168, 178, 188, and 198 may change. In one aspect, the change in the reflection off of the reflective elements 148, 158, 168, 178, 188, and 198 may be detected by the image sensor 220 and interpreted by a processing element as an indication of actuating of the corresponding respective input element 140, 150, 160, 170, 180, and 190. In one aspect, the reflection pattern off of each of the reflective elements 148, 158, 168, 178, 188, and 198 in a nonactuated state may be unique with respect to the reflection pattern off of the other reflective elements 148, 158, 168, 178, 188, and 198. In certain embodiments, there may be no reflected light when the input element is not actuated. In other embodiments, there may be reflected light when the input element is not actuated.

Figure 5A:
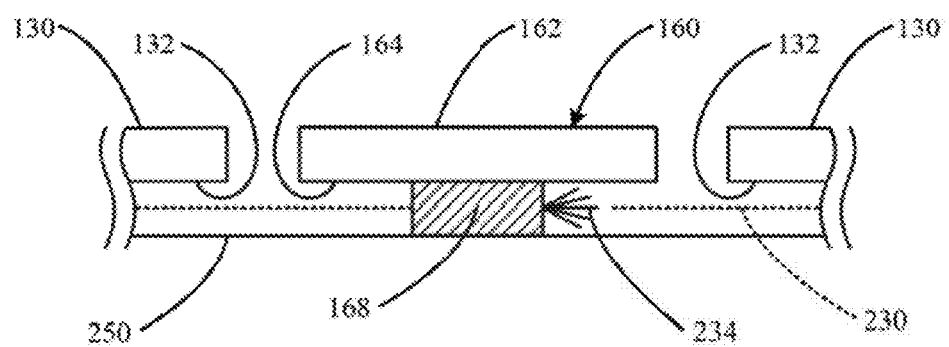
FIG. 5A is a simplified side view diagram illustrating an example operation of the example input element associated with the control panel of FIGS. 2 and 3 in accordance with certain embodiments of the disclosure.
Figure 5B:
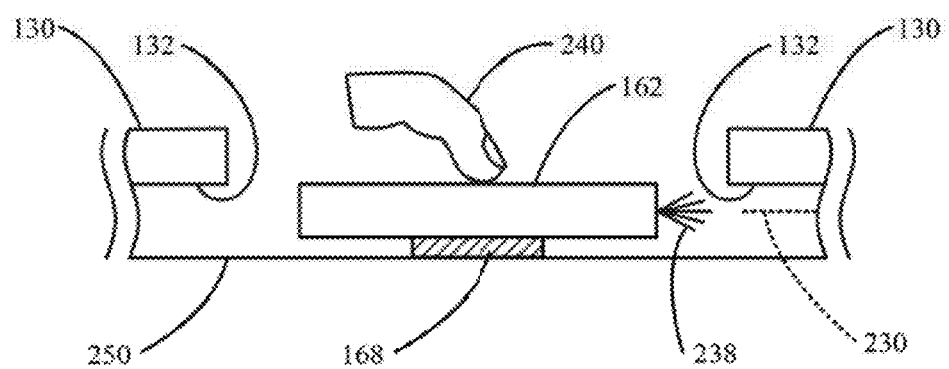
FIG. 5B is a simplified side view diagram illustrating an example operation of the example input element associated with the control panel of FIGS. 2 and 3 in accordance with certain embodiments of the disclosure.

Referring now to FIGS. 5A and 5B, an example mechanism of detecting the actuation of input elements is discussed. As illustrated with particular focus on input element 160, laser plane 230 emitted by illumination source 200 may reflect off of reflective element 168 when input element 160 is not actuated as reflected light 234. In this embodiment, the input element 160, as well as the rear surface 132 of the front face 124, may be mounted to a backing mount 250. In certain embodiments, the reflective element 168 may, in particular, be mounted to the backing surface 250 by any mechanism aforementioned, such as with adhesives. The laser plane 230 may be provided between the backing mount 250 and the rear surface 132 of the front face 124.

In a non-actuated state as depicted in FIG. 5A, the image sensor 220 may detect the reflected light 234. The reflected light 234 off of reflective element 168 may be unique relative to any reflected light from other reflective elements 148, 158, 178, 188, and 198 that may be detected by the image sensor 220. The uniqueness of the reflected light 234 as detected by the image sensor 220 may be in its intensity, vertical spread, horizontal spread, intensity spatial roll-off or the like. In one aspect, the uniqueness of the reflected light 234 relative to reflected light from other reflective elements 148, 158, 178, 188, and 198 may be used to identify a region of interest associated with the unique reflected light 234 corresponding to the input element 160.

In FIG. 5B, actuation of the example input element 160 by pressing with finger 240 is depicted. As a result of force applied to surface 162 of the input element 162, the reflective element 168 may compress. As a result, a reflected light 238 from input element 160 may no longer be reflected off of the reflective element 168 in certain embodiments. In some cases, the reflected light 238 may be reflected off of other portions of the input element 160 as depicted. In certain other embodiments, the reflected light 238 may still be reflected off of the reflective element 168, the reflection profile of the reflected light 238 when the input element 160 is actuated, or pressed with the finger 240, may be different than the reflected light 234 when the input element 160 is not actuated. Therefore, in either case, the reflected light 238 detected by the image sensor 220 when the input element 160 is pressed with finger 240 may be different than the reflected light 234 when the input element 160 is in a non-actuated state. The image sensor 220 may produce signals indicative of the change in the reflected light 234 to reflected light 238 and provide to same to a processing unit for further interpretation. In one aspect, repeated sampling by the image sensor 220 at a particular frame rate may enable detecting the change in the reflected light 234 to reflected light 238.

In certain other example embodiments, as depicted in FIGS. 6A and 6B, and again illustrated with particular focus on input element 160, laser plane 230 emitted by illumination source 200 may not reflect off of reflective element 168 when input element 160 is not actuated. In this embodiment, the input element 160, as well as the rear surface 132 of the front face 124, may be mounted to a backing surface 252. In certain embodiments, the input element 160 may be mounted to the backing surface 252 using mounting springs 244 attached at one end to the rear surface 164 of the input element 160 and on the other end to the backing surface 252. Alternatively, the input element 160 may be mounted onto the backing surface 252 using any suitable compressible material between the rear surface 164 of the input element 160 and the backing surface 252.

While two mounting springs 244 are depicted in sectional side view, there may be any suitable number of mounting springs 244 or other relatively compressible materials provided between the input element 160 and the backing surface 252. Additionally, while the mounting springs 244 are shown to be disposed between the rear surface 164 of the input element 160 and the backing surface 252, the mounting springs 244 or other relatively compressible materials may be provided between any suitable location on the input element 160, such as on a sidewall of the input element 160, and the backing surface 252.

Figure 6A:
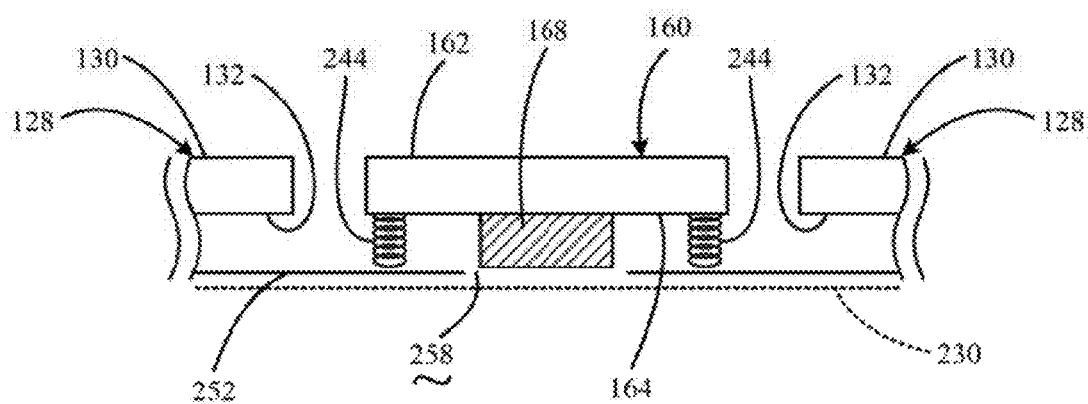
FIG. 6A is a simplified side view diagram illustrating another example operation of the example input element associated with the control panel of FIGS. 2 and 3 in accordance with certain embodiments of the disclosure.

In an non-actuated state, input element 160 may be above the backing surface 252, and the laser plane 230 may be below the backing surface 252 as depicted in FIG. 6A. In this non-actuated state, the laser plane may be substantially unperturbed by the reflective surface 168. In other words, there may be no reflection of the laser plane 230 off of the reflective surface 168 in the non-actuated state.

Figure 6B:
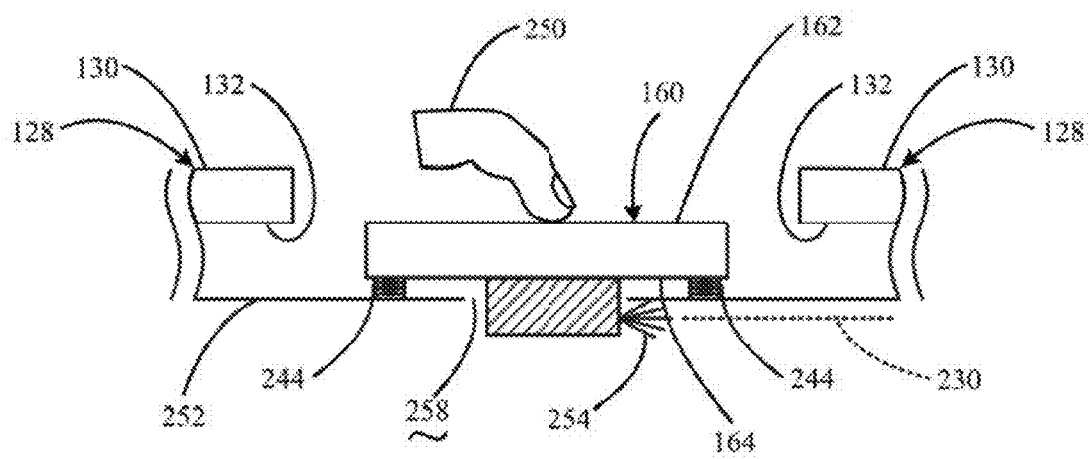
FIG. 6B is a simplified side view diagram illustrating an example operation of the example input element associated with the control panel of FIGS. 2 and 3 in accordance with certain embodiments of the disclosure.

The backing surface 252 may include an opening 258, and the opening 258 may be positioned and sized such that the reflective surface 168 may pass or partially pass through the opening 258 when the input element 160 is actuated or pressed by finger 250 as depicted in FIG. 6B. In other words, when the input element 160 is pressed and, therefore, when force is exerted on the front surface 162 of the input element 160, the mounting springs 244 may compress and, therefore, the reflective surface 168 may pass or partially pass through the opening 258. When the input element 160 is in an actuated state, with the reflective surface 168 at least partially passing through the opening 258, the reflective surface 168 may perturb the laser plane 230. As a result, reflected light 254 may be reflected off of the reflective element 168. In one aspect, the reflected light 254 off of the reflective element 168 may be detected by the image sensor 220. The reflected light 254 off of reflective element 168 may be unique relative to any reflected light from other reflective elements 148, 158, 178, 188, and 198 that may be detected by the image sensor 220. The uniqueness of the reflected light 234 as detected by the image sensor 220 may be in its intensity, vertical spread, horizontal spread, intensity spatial roll-off, or the like. In one aspect, the uniqueness of the reflected light 254 relative to reflected light from other reflective elements 148, 158, 178, 188, and 198 may be used to identify a region of interest corresponding to the input element 160 and associated with the unique reflected light 254. In considering all of the input elements 140, 150, 160, 170, 180, and 190 provided in a similar manner as input element 160 on the control panel 120, the actuated ones of the input elements 140, 150, 160, 170, 180, and 190 may be ascertained based on unique reflected light detected by the image sensor 220 according to unique features of each of the corresponding respective reflective elements 148, 158, 168, 178, 188, and 198. The image sensor 220 may produce signals indicative of the reflected light 254 and provide to same to a processing unit for further interpretation and analysis. In one aspect, repeated sampling by the image sensor 220 at a particular frame rate may enable detection of the change from substantially no reflected light associated with the input element 160 to reflected light 254 associated therewith.

While the aforementioned embodiments discussed with reference to FIGS. 5A-6B provide two example embodiments with two actuation states, such as non-actuated and actuated, it will be appreciated that a particular input element may have any number of actuation states associated therewith. For example, an input element may be configured to be pressed at more than one location thereon. In other words, the input element when actuated at different locations thereon, may indicate separate actuation states, such as a first actuation state, second actuation state, a third actuation state, or a fourth actuation state. An example of such an embodiment may include a square shaped input element, where each of the sides of the input element may be pressed by a user to affect a separate control function associated therewith. An application of the same may be, for example, a radio control, where pressing the top of the input element may be associated with increasing the sound volume, pressing the bottom of the input element may be associated with decreasing the sound volume, pressing the left of the input element may be associated with tuning to a station with a lower radio carrier frequency, and pressing the top of the input element may be associated with tuning to a station with a greater radio carrier frequency. With such an input element, pressing each of the sides of the input element may result in a change in the reflection pattern resulting from the corresponding reflective element associated with the input element. In one aspect, the reflection pattern detected by the image sensor for each of the four states of the input elements may be unique and distinguishable from each other. Therefore, the image sensor signal may be indicative of one or more of the four states and a processing element may interpret the same to determine the user intended functionality associated therewith. In one aspect, the input element may have four distinct reflective elements provided on the corners of the input element on the rear surface. Reflections from the combination of various reflective elements may be interpreted to ascertain the user intended actuation state of the input element.

Certain other embodiments may include a dial input element provided on the control panel. This type of a dial input element may be used for a continuous scrolling input. One application of the same may be the control of temperature in the interior of the vehicle where a clockwise motion may be associated with increasing the temperature and a counter-clockwise motion may be associated with decreasing the temperature. In such an implementation, one or more reflective elements may be disposed on the rear surface of the dial input element. The one or more reflective elements may rotate as the dial input element is rotated by the user. The one or more reflective elements may further perturb the laser plane, such that as the one or more reflective elements rotate, the reflections therefrom vary. The varying reflection therefrom may be detected by the image sensor and the image sensor may further provide image sensor signals indicative of the same. The image sensor signals may be proceeded by a processing element to interpret the movement of the dial input interface and the control functions associated with the determined motion.

Certain other embodiments may include a slider input element provided on the control panel. This type of a slider input element may be used, for example, for a pseudo-continuous range input within an upper bound and lower bound. One application of the same may be the control of forced air or fan in the interior of the vehicle where an up or right motion of the slider may be associated with increasing the air velocity and a down or left motion may be associated decreasing the air velocity. In such an implementation, one or more reflective elements may be disposed on the rear surface of the slider input element. The one or more reflective elements may move in a corresponding fashion as the slider input element is slid by the user. The one or more reflective elements may further perturb the laser plane, such that as the one or more reflective elements move, the reflections therefrom vary. The varying reflection therefrom may be detected by the image sensor, and the image sensor may further provide image sensor signals indicative of the same. In one aspect, the variation in the reflection may include a spatial movement of the point from where the reflection originates. The image sensor signals may be proceed by a processing element to interpret the movement of the dial input interface and the control functions associated with the determined motion.

It may be appreciated that the center console may have any variety of input elements associated therewith. These input elements, when actuated between two or more actuated states may result in a change in reflection associated with perturbing a laser plane that may be detected by the image sensor and subsequently processed by a processing element to interpret respective control functions.

Figure 7:
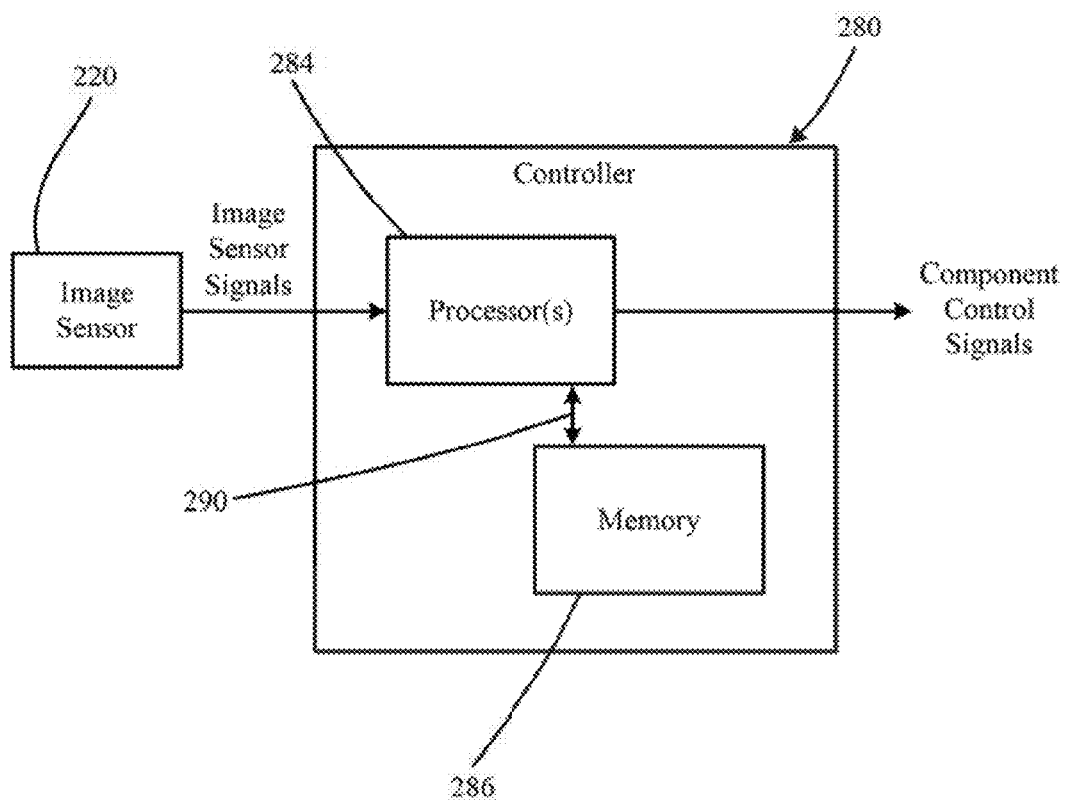
FIG. 7 is a simplified block diagram illustrating an example system for receiving sensor input from the control panel of FIGS. 2 and 3 and providing component control signals in accordance with embodiments of the disclosure.

Referring now to FIG. 7, an example system 280 for providing component control signals based on user interaction with control panels, such as the center console 120 in accordance with embodiments of the disclosure, is illustrated. The system 280 may include one or more processors 284 communicatively coupled to an electronic memory 286 via a communicative link 290. The one or more processors 284 may further be communicatively coupled to the image sensor 220 and receive image sensor signals generated by the image sensor 220.

The one or more processors 284 may include, without limitation, a central processing unit (CPU), a digital signal processor (DSP), a reduced instruction set computer (RISC), a complex instruction set computer (CISC), a microprocessor, a microcontroller, a field programmable gate array (FPGA), or any combination thereof. The system 280 may also include a chipset (not shown) for controlling communications between the one or more processors 284 and one or more of the other components of the system 280. In certain embodiments, the system 280 may be based on an Intel® Architecture system and the one or more processors 284 and chipset may be from a family of Intel® processors and chipsets, such as the Intel® Atom® processor family. The one or more processors 284 may also include one or more application specific integrated circuits (ASICs) or application specific standard products (ASSPs) for handling specific data processing functions or tasks.

The memory 286 may include one or more volatile and/or non-volatile memory devices including, but not limited to, magnetic storage devices, read only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, or combinations thereof.

In certain embodiments, the one or more processors 284 may be part of an in-vehicle infotainment (IVI) system. In other embodiments the one or more processors 284 may be dedicated to the system 280 for providing component control signals. Therefore, in such embodiments, the system 280 is separate from the IVI system. However, the system 280 may optionally communicate with the IVI system of the vehicle. It should also be noted that the system 280 may be part of or otherwise associated with a main computer of the vehicle. The software associated with the system 280 may further be stored on a server or a cloud server and may be transferred to the system 280 of the vehicle via one or more of a wired connection, a wireless connection, a smart key, a universal serial bus (USB) drive, or the like.

During operation of the system 280, the one or more processors 284 may receive image sensor signals from the image sensor 220. As discussed with reference to FIGS. 5A-6B, the image sensor signal may provide information on the optical reflections associated with actuation states of one or more input elements 140, 150, 160, 170, 180, and 190. Therefore, the one or more processors 284 may analyze the image sensor signal to determine if a user has actuated one or more of the input elements 140, 150, 160, 170, 180, and 190. The determination may be made by analyzing the characteristics of optical reflection 234 and 254 from the reflective elements 148, 158, 168, 178, 188, and 198 perturbing the laser plane 230. For example, if the optical reflection is indicative of reflective element 188, then the one or more processors may determine that the user intended to touch the Bluetooth® controller input element 180. In one aspect, the electronic memory 286 may store software programs or other instruction sets that when run on the one or more processors 284, enables the determination of the input elements that were touched by the finger 240 and 250 based upon the image sensor signal provided by the image sensor 220. In addition, the electronic memory may further store, such as in a database, a mapping of the unique characteristics of the optical reflection associated with each actuation state of each of the input elements 140, 150, 160, 170, 180, and 190. Such a mapping may be used by the one or more processors 184 for comparing a particularly detected optical reflection to expected reflection patterns to ascertain the input element and actuation state associated with the particular detected optical reflection or the absence of the particular detected optical reflection.

In certain embodiments, the software and programs, as stored on the electronic memory 286, may incorporate additional logic for ascertaining if a touch by the user's finger 244 was intentional. In certain cases, especially in a vehicle setting, one may touch one or more of the input elements 140, 150, 160, 170, 180, and 190 unintentionally. For example, if a user's finger 244 is close to the center console 120 and the vehicle travels over a bump, the finger may accidentally touch one or more of the input elements 140, 150, 160, 170, 180, and 190 of the center console 120. Therefore, in addition to ascertaining the region of interest associated with the location of the optical reflection and identifying input elements 140, 150, 160, 170, 180, and 190 according to their optical reflections from the respective reflective elements 148, 158, 168, 178, 188, and 198, the one or more processors may additionally determine if a touch event or actuation was intentional. For example, if the one or more processors 284, based on the image sensor signal, detects a relatively fast actuation or a double actuation of a particular input element 140, 150, 160, 170, 180, and 190, then the one or more proccessors may deem the initial touch event to be unintentional and ignore the same. In other aspects, the one or more processors 284 may detect other indicators that may be symptomatic of accidentally touching the center console 120 due to movement of the vehicle.

Once the one or more processors 284 determine the actuation of one or more input elements 140, 150, 160, 170, 180, and 190 and an associated user intended action of one or more components, the one or more processors 284 may generate a control signal for the same. The one or more processors may subsequently provide the control signal directly to the component or to a vehicle computer that can subsequently control the component based on the component control signal generated by the one or more processors 284. As a non-limiting example, if the one or more processors 284 determine that the user would like the temperature setting of the air conditioner lowered, then the one or more processors 284 may generate a control signal for the air conditioner that controls the air conditioner to lower the temperature setting. The control signals linked to each of the components may be stored on the electronic memory 286 for access by the one or more processors 284. In one aspect, the control signals may be stored on the electronic memory 286 organized as a lookup table. For example, if the one or more processors 284 decipher an intended control action by a user based upon the image sensor signal, the one or more processors 284 may access the electronic memory 286 to access the component control signals associated with the control action. In certain embodiments, the intended control action may be ascertained as a multi-input mechanism. For example, the a control action may be interpreted as a voice command after a actuating one of more input elements 140, 150, 160, 170, 180, and 190.

It should be noted that the control system shown herein for the control of components of the vehicle utilizes less electrical wiring and connectors compared to conventional wired control schemes. The input elements 140, 150, 160, 170, 180, and 190 are not directly or indirectly coupled electrically to the components to which they correspond. This is quite different from control panels where one or more switches may be electrically coupled either directly or indirectly to corresponding components with the use of conductive elements, such as connectors, wires, circuit boards, and the like. Therefore, the control panels, as disclosed herein, may have fewer electrical and mechanical elements that can fail during use and may provide a relatively cost effective and streamlined solution to controlling components of a vehicle. In one aspect, the manufacture of the center console 120 may have a relatively reduced bill of materials in comparison to wired control panels. In another aspect, the center console 120 may have relatively fewer elements that can fail and therefore may be easier to troubleshoot and repair than a wired control panel. In yet another aspect, the center console 120 may be relatively lighter than wired control panels and, therefore, may result in fuel savings during the operation of the vehicle. In certain aspects, the center console, as disclosed herein, may be customized.

Figure 8:
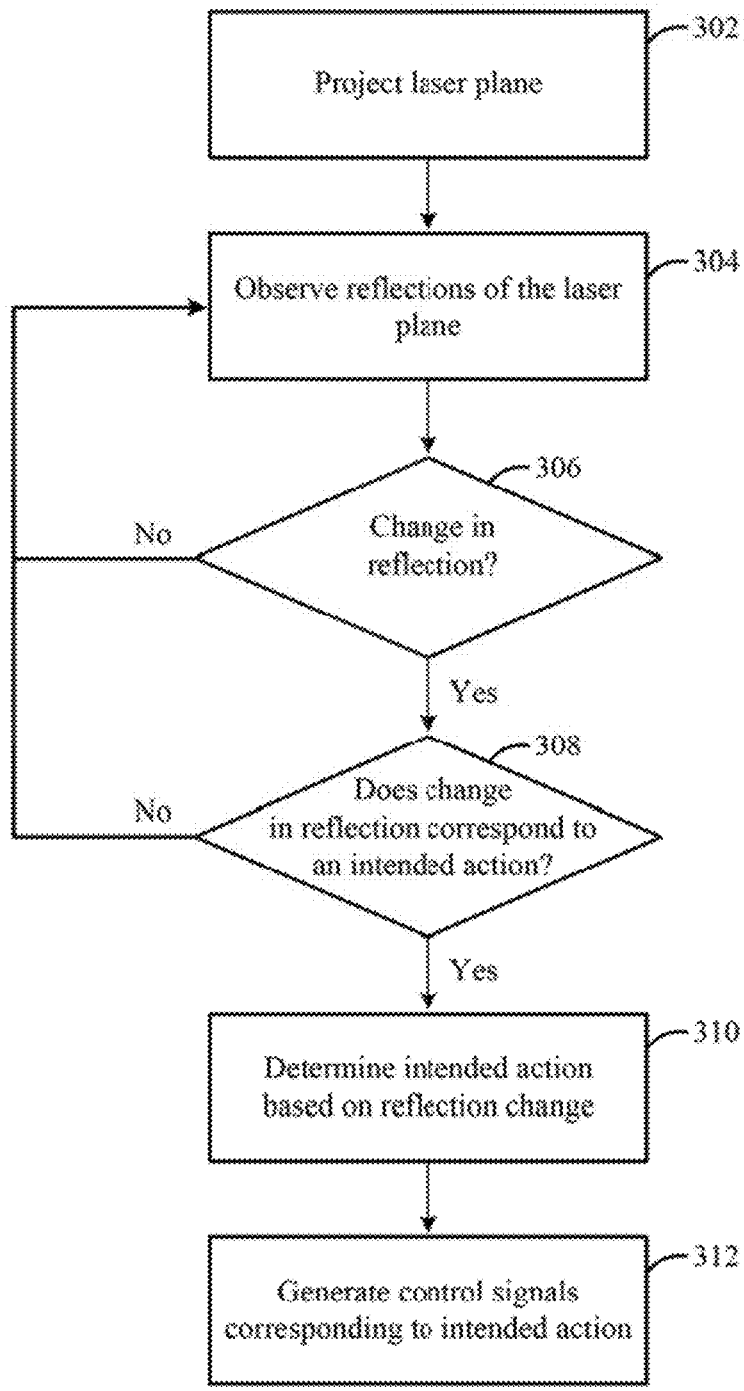
FIG. 8 is a flow chart illustrating an example method of providing control signals to control a component in accordance with embodiments of the disclosure.

Referring now to FIG. 8, a method 300 for providing component control signals in accordance with embodiments of the disclosure are illustrated. At block 302, a laser plane may be projected. The laser plane may be projected in a manner such that the plane can, under certain conditions, be perturbed by one or more of the input elements 140, 150, 160, 170, 180, and 190). The control panel is monitored as discussed in conjunction with FIGS. 3-6B.

At block 304, reflections in the laser plane may observed. As shown in conjunction with FIGS. 3-6B, the control panel 120 and associated input elements 140, 150, 160, 170, 180, and 190 may be monitored by the image sensor 220. The image sensor signal associated with the same may be provided to the one or more processors 184.

At block 306, it is determined whether a change in reflection has been detected. The determination may be made by the one or more processors 184 based on frame by frame analysis of the image sensor signals provided by the image sensor 220. If it is determined that a change in reflection has not been detected, then the method 300) may return to block 304 to continue monitoring reflections of the laser plane.

However, if it is determined at block 306 that there is an observed change in reflection from the laser plane, then operations may continue at block 308, and it may be determined whether the observed change in reflection corresponds to an intended action. To do so, the one or more processors 284 may compare one or more reflection profiles against a database of reflection profiles mapped to a corresponding input elements 140, 150, 160, 170, 180, and 190 and actuation states or control actions associated therewith. As discussed in reference to FIG. 7, a database of reflection profiles may be stored on the electronic memory 286. For the purposes of this discussion, a reflection profile may include information on intensity, spatial location, vertical spread, horizontal spread, intensity spatial roll-off or the like of a detected optical reflection. If it is determined that the observed change in reflection does not correspond to an intended action, then the method 300 may return to block 304 to continue monitoring reflections of the laser plane. In certain embodiments, it may additionally be determined if a change in reflection was an intended actuation by the user. This may be done by timing the actuation time with a timer and determining whether the time of actuation corresponds to an intended actuation.

However, if it is determined at block 308 that the observed change in reflection does correspond to an intended action, then at block 310, the intended action may be determined based on the reflection change. At block 312, control signals may be generated corresponding to the intended action. The control signals may be in a format or standard that can be provided to a variety of components of the vehicle or to the vehicle main computer for subsequent routing to control components.

It should be noted that the method 300 may be modified in various ways in accordance with certain embodiments of the disclosure. For example, one or more operations of method 300 may be eliminated or executed out of order in other embodiments of the disclosure. Additionally, other operations may be added to method 300 in accordance with other embodiments of the disclosure.

Embodiments described herein may be implemented using hardware, software, and/or firmware to perform the methods and/or operations described herein. Certain embodiments described herein may be provided as a tangible machine-readable medium storing machine-executable instructions that, if executed by a machine, cause the machine to perform the methods and/or operations described herein. The tangible machine-readable medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of tangible media suitable for storing electronic instructions. The machine may include any suitable processing or computing platform, device or system and may be implemented using any suitable combination of hardware and/or software. The instructions may include any suitable type of code and may be implemented using any suitable programming language. In other embodiments, machine-executable instructions for performing the methods and/or operations described herein may be embodied in firmware. Additionally, in certain embodiments, a special-purpose computer or a particular machine may be formed in order to identify actuated input elements and process the identifications.

Various features, aspects, and embodiments have been described herein. The features, aspects, and embodiments are susceptible to combination with one another, as well as to variation and modification, as will be understood by those having skill in the art. The present disclosure should, therefore, be considered to encompass such combinations, variations, and modifications.

The terms and expressions, which have been employed herein, are used as terms of description and not of limitation. There is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While certain embodiments of the invention have been described in connection with what is presently considered to be the most practical and various embodiments, it is to be understood that the invention is not to be limited to the disclosed embodiments. On the contrary, the invention is intended to cover various modifications and equivalent arrangements included within the scope of the claims. Although specific terms are employed herein, they are used in a generic and descriptive sense only, and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method comprising executing computer executable instructions by one or more processors for:
  receiving one or more reflected light patterns comprising one or more predefined regions of interest corresponding to positions associated with one or more input elements;
  determining, relative to at least one threshold, respective intensity levels corresponding to the one or more predefined regions of interest;
  interpreting, at least in part by the determined intensity levels, one or more actuation states associated with the one or more input elements; and
  outputting one or more commands associated with the interpreted actuation states.

2. The method of claim 1, further comprising removing at least one artifact from the one or more reflected light patterns.

3. The method of claim 1, wherein the one or more actuation states comprise one or more of: normal, depressed normal level 1, depressed normal level 2, depressed first edge tilt, depressed second edge tilt, depressed third edge tilt, or depressed fourth edge tilt.

4. The method of claim 1, wherein determining the intensity levels of the one or more predefined regions comprises determining if light is reflected from at least a portion of the one or more input elements.

5. The method of claim 1, wherein interpreting the one or more actuation states comprises a comparison of the determined intensity levels to a plurality of predetermined patterns.

6. The method of claim 5, wherein the plurality of predetermined patterns correspond to the information associated with the interpreted actuation states.

7. The method of claim 1, wherein outputting information comprises outputting one or more of vehicle control commands, climate control commands, audio system commands, window control commands, seat control commands, display control commands, web commands, or communications control commands.

8. A vehicle comprising:
  one or more input elements;
  at least one light sensor array;
  one or more light sources configured for providing light for reflecting from at least a portion of the one or more input elements to the at least one light sensor array;
  one or more processors configured to:
    receive one or more detected patterns from the at least one light sensor array, wherein the one or more detected patterns comprise one or more predefined regions of interest corresponding to positions associated with the one or more input elements;
    determine, relative to at least one threshold, respective intensity levels corresponding to the one or more predefined regions of interest;
    interpret, at least in part by the determined intensity levels, one or more actuation states associated with the one or more input elements; and
    output one or more commands corresponding to the interpreted actuation states.

9. The vehicle of claim 8, wherein the one or more input elements are individually depressible by an occupant of the vehicle, and wherein each or the input elements comprise at least one surface for selectively reflecting light from the one or more light sources to a field of view associated with the at least one light sensor array based at least in part on the actuation state.

10. The vehicle of claim 9, wherein the one or more input elements comprise a curved surface for concentrating or focusing reflected light.

11. The vehicle of claim 8, wherein the one or more processors are further configured to remove at least one artifact from the one or more detected patterns.

12. The vehicle of claim 8, wherein the one or more actuation states comprise one or more of: normal, depressed normal level 1, depressed normal level 2, depressed first edge tilt, depressed second edge tilt, depressed third edge tilt, or depressed fourth edge tilt.

13. The vehicle of claim 8, wherein the one or more processors are configured to determine the intensity levels of the one or more predefined regions by determining if light is reflected from at least a portion of the one or more input elements.

14. The vehicle of claim 8, wherein the one or more processors are configured to interpret the one or more actuation states based at least in part upon a comparison of the determined intensity levels to a plurality of predetermined patterns.

15. The vehicle of claim 14, wherein the plurality of predetermined patterns correspond to the one or more commands.

16. The vehicle of claim 8, wherein the one or more commands comprise one or more of vehicle control commands, climate control commands, audio system commands, window control commands, seat control commands, display control commands, web commands, or communications control commands.

17. An apparatus comprising:
at least one memory for storing computer-executable instructions; and
one or more processors configured to access the at least one memory and execute the computer-executable instructions to:
receive one or more detected patterns from at least one light sensitive array, wherein the one or more detected patterns comprise one or more predefined regions of interest corresponding to positions associated with one or more input elements;
determine, relative to at least one threshold, relative intensity levels corresponding to the one or more predefined regions of interest;
interpret, at least in part by the determined intensity levels, one or more actuation states associated with the one or more input elements; and
output one or more commands corresponding to the interpreted actuation states.

18. The apparatus of claim 17, further comprising:
one or more input elements attached to the vehicle, at least one camera attached to the vehicle and one or more light sources configured for providing light for reflecting from at least a portion of the one or more input elements to the at least one camera.

19. The apparatus of claim 18, wherein the one or more input elements are individually depressible by an occupant of the vehicle, and wherein each of the input elements comprise at least one surface for selectively reflecting light from the one or more light sources to a field of view associated with the at least one camera based at least in part on the actuation state.

20. The apparatus of claim 19, wherein the one or more input elements comprise a curved surface for concentrating or focusing reflected light.

21. The apparatus of claim 17, the one or more processors are further configured to remove at least one artifact from the one or more detected patterns.

22. The apparatus of claim 17, wherein the one or more actuation states comprise one or more of: normal, depressed normal level 1, depressed normal level 2, depressed first edge tilt, depressed second edge tilt, depressed third edge tilt, or depressed fourth edge tilt.

23. The apparatus of claim 17, wherein the one or more processors are configured to determine the intensity levels of the one or more predefined regions by determining if light is reflected from at least a portion of the one or more input elements.

24. The apparatus of claim 17, wherein the one or more processors are configured to interpret the one or more actuation states based at least in part upon a comparison of the determined intensity levels to a plurality of predetermined patterns.

25. The apparatus of claim 17, wherein the plurality of predetermined patterns correspond to the one or more commands.

26. The apparatus of claim 17, wherein outputting the one or more commands comprises outputting one or more of vehicle control commands, climate control commands, audio system commands, window control commands, seat control commands, display control commands, web commands, or communications control commands.

27. A non-transitory computer readable media comprising computer-executable instructions that, when executed by one or more processors, configure the one or more processors to:
receive one or more detected patterns from at least one light sensitive army wherein the one or more detected patterns comprise one or more predefined regions of interest corresponding to positions associated with one or more input elements;
determine, relative to at least one threshold, relative intensity levels corresponding to the one or more predefined regions of interest;
interpret, at least in part by the determined intensity levels, one or more actuation states associated with the one or more input elements; and
output one or more commands corresponding to the interpreted actuation states.

28. The non-transitory computer readable media of claim 27, further comprising computer-executable instructions that configure the one or more processors to determine the intensity levels of the one or more predefined regions by determining if light is reflected from at least a portion of the one or more input elements.

29. The non-transitory computer readable media of claim 27, wherein the one or more actuation states are interpreted at least in part by a comparison of the determined relative intensity levels to a plurality of predetermined patterns.

30. The non-transitory computer readable media of claim 27, wherein the one or more commands comprises one or more of vehicle control commands, climate control commands, audio system commands, window control commands, seat control commands, display control commands, web commands, or communications control commands.

* * * * *